United States Patent
Ilic et al.

(10) Patent No.: US 8,815,329 B2
(45) Date of Patent: Aug. 26, 2014

(54) DELIVERED ENERGY COMPENSATION DURING PLASMA PROCESSING

(75) Inventors: Milan Ilic, Fort Collins, CO (US); Darren File, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1443 days.

(21) Appl. No.: 12/328,831

(22) Filed: Dec. 5, 2008

(65) Prior Publication Data
US 2010/0141221 A1 Jun. 10, 2010

(51) Int. Cl.
G05F 1/10 (2006.01)
C23C 16/52 (2006.01)
H01J 37/32 (2006.01)

(52) U.S. Cl.
CPC ....... *H01J 37/3299* (2013.01); *H01J 37/32935* (2013.01); *H01J 37/32064* (2013.01); *H01J 37/32944* (2013.01)
USPC ...... 427/8; 427/569; 204/192.13; 204/298.03

(58) Field of Classification Search
None
See application file for complete search history.

(56) References Cited

U.S. PATENT DOCUMENTS

| | | | |
|---|---|---|---|
| 4,853,046 A * | 8/1989 | Verhoff et al. ............... | 148/222 |
| 5,314,603 A | 5/1994 | Sugiyama et al. | |
| 5,936,481 A | 8/1999 | Fujii | |
| 6,001,227 A * | 12/1999 | Pavate et al. ............. | 204/298.12 |
| 6,057,244 A * | 5/2000 | Hausmann et al. ........... | 438/706 |
| 6,222,321 B1 * | 4/2001 | Scholl et al. ............. | 315/111.21 |
| 6,332,961 B1 * | 12/2001 | Johnson et al. .......... | 204/192.13 |
| 6,509,542 B1 | 1/2003 | Benjamin et al. | |
| 6,521,302 B1 * | 2/2003 | Campana-Schmitt et al. ............................. | 427/574 |
| 6,972,071 B1 * | 12/2005 | Tyler ........................ | 156/345.47 |
| 7,081,598 B2 * | 7/2006 | Ilic et al. .................. | 219/121.59 |
| 7,445,695 B2 * | 11/2008 | Ilic et al. .................. | 204/192.12 |
| 7,589,031 B2 * | 9/2009 | Anwar et al. ................ | 438/788 |
| 8,217,299 B2 * | 7/2012 | Ilic et al. .................. | 219/121.57 |
| 8,395,078 B2 * | 3/2013 | Ilic ........................... | 219/121.59 |
| 2004/0031699 A1 * | 2/2004 | Shoji .......................... | 205/791.5 |
| 2004/0182697 A1 | 9/2004 | Buda | |
| 2006/0032738 A1 * | 2/2006 | Wiedemuth et al. ...... | 204/192.12 |
| 2006/0241879 A1 * | 10/2006 | van Zyl ........................... | 702/60 |
| 2006/0252283 A1 * | 11/2006 | Takeda et al. ................. | 438/798 |
| 2007/0214727 A1 * | 9/2007 | Egan et al. ...................... | 51/295 |
| 2007/0251813 A1 | 11/2007 | Ilic et al. | |

(Continued)

OTHER PUBLICATIONS

Notification of Transmittal of International Search Report and Written Opinion for PCT/US09/66681 mailed Feb. 19, 2010.

(Continued)

*Primary Examiner* — Marianne L Padgett
(74) *Attorney, Agent, or Firm* — Neugeboren O'Dowd PC (57) ABSTRACT

An apparatus and method for controlling an application of power to power a plasma chamber. A detector detects actual power out from the power stage to the plasma chamber during a sampling interval. A compare module compares the actual power out during the sampling interval to a present power setting during the sampling interval and generates a compensation value. An adjust module updates the present power setting for the power stage with the compensation value to provide a new power setting for the power stage to control the power out from power stage to the plasma chamber during the deposition process whereby power losses occurring during the deposition process are compensated during the deposition process. If there is a fixed time period for the deposition process, the compensation method and apparatus may be used to compensate the deposition process for energy losses without extending the duration of the deposition process.

11 Claims, 10 Drawing Sheets

(56) References Cited

U.S. PATENT DOCUMENTS

| | | | |
|---|---|---|---|
| 2008/0122369 A1* | 5/2008 | Nitschke | 315/111.21 |
| 2009/0008240 A1* | 1/2009 | Ilic et al. | 204/192.1 |
| 2009/0289034 A1* | 11/2009 | Nitschke | 216/67 |
| 2010/0140231 A1* | 6/2010 | Ilic | 219/121.54 |
| 2012/0249006 A1* | 10/2012 | Burrows | 315/209 T |
| 2013/0180964 A1* | 7/2013 | Ilic | 219/121.54 |

OTHER PUBLICATIONS

"International Preliminary Report on Patentability re Application PCT/US2009/066681", Jun. 16, 2011, Published in: CH, PCT report published Feb. 18, 2010.

\* cited by examiner

DELIVERED ENERGY COMPENSATION DURING PLASMA PROCESSING

FIELD OF THE INVENTION

This invention relates generally to plasma deposition processes. More particularly, the invention relates to power control of deposition process.

BACKGROUND OF THE INVENTION

In a plasma deposition process, the desired deposition of material on a target in a plasma chamber may be controlled by setting the amount of delivered energy used in the deposition process. To control the delivered energy, a controller controls the output power from the power stage to the plasma chamber based on a power setting. The power setting is a control input set by the user of the equipment to deliver the energy needed to complete the deposition process during the deposition period.

A problem arises in that the actual energy delivered to the plasma chamber varies and does not match the energy called for by the power setting. Further, the variation in actual energy delivered is not a repeatable function so it is not possible to simply preprogram the delivery of more desired energy to compensate for the reduced actual energy delivered. One cause of variations in actual energy delivered is arcing within the plasma chamber. A single arc and its arc recovery interval may last only microseconds. However, there may be several thousand arcs occurring within a second. As a result the actual delivered energy can be 5%-10% lower than the desired energy programmed for delivery in the deposition process over the deposition period.

SUMMARY OF THE INVENTION

In one embodiment of the present invention, a power supply includes: a detector configured to detect actual power out from a power stage to a plasma chamber during a sampling interval; a compare module configured to compare actual power out during the sampling interval to a present power setting during the sampling interval and to generate a compensation value; and an adjust module configured to update the present power setting for the power stage with the compensation value to provide a new power setting for the power stage to control the power out from power stage to the plasma chamber whereby power losses occurring during the deposition process are compensated during the deposition process.

In another embodiment, control of a power supply includes: detecting power applied by the power supply to a plasma chamber during a sampling interval; comparing the power actual power out during the sampling interval to a present power setting during the sampling interval and generating a compensation value; and adjusting the present power setting for the power stage with the compensation value to provide a new power setting for the power stage to control the power out from power stage to the plasma chamber during the deposition process whereby power losses occurring during the deposition process are compensated during the deposition process.

DETAILED DESCRIPTION OF THE INVENTION

Figure 1:
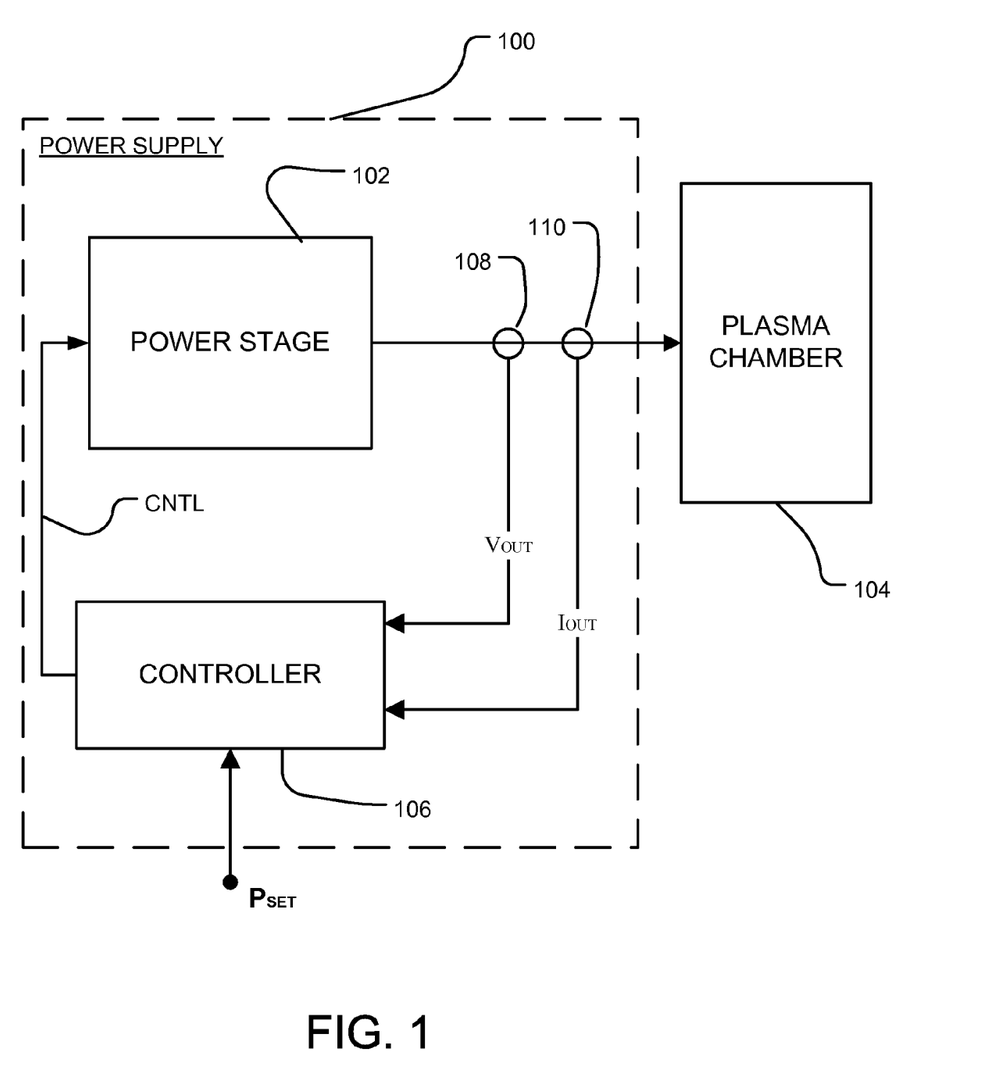
FIG. 1 shows one embodiment of the invention used to provide power out to a single cathode plasma chamber or a multiple cathode plasma chamber.

In the plasma deposition system of FIG. 1 a power supply 100 incorporates one or more embodiments of a controller 106. The power stage 102 will generate AC (alternating current) power or DC (direct current) power to drive a plasma chamber 104. The power from the power stage 102 is applied to the plasma chamber 104. If the power stage 102 is powering dual cathodes, AC power is applied. If the power stage 102 is powering a single cathode, DC power is applied. If the plasma chamber has multiple cathodes, multiple power supplies may be utilized.

The illustrated arrangement of these components is logical, the connections between the various components are exemplary only, and the depiction of this embodiment is not meant to be an actual hardware diagram; thus, the components can be combined or further separated in an actual implementation. Moreover, the components can be connected in a variety of ways without changing the basic operation of the system. For example, the controller 106 (which may be realized by hardware, firmware, software, or a combination thereof) may be distributed among separate components.

As depicted, controller 106 receives a power setting $P_{SET}$ (e.g., from an operator of the plasma deposition system), and in addition, voltage $V_{OUT}$, and current $I_{OUT}$, which are output from the power stage 102 to the plasma chamber 104, are sensed by sensors 108 and 110, respectively, and fed back as inputs to controller 106. In this way the controller 106 can monitor the power (e.g., actual power) and energy being delivered during the deposition process. Many variations of the controller 106 adjust the gate drive signals and pass them to power switches in the power stage 102 to adjust $V_{OUT}$ and $I_{OUT}$ applied to the plasma chamber 104. The power switches may be MOSFETs or power MOSFETs, but could also be IGBTs to mention a few examples.

Figure 2:
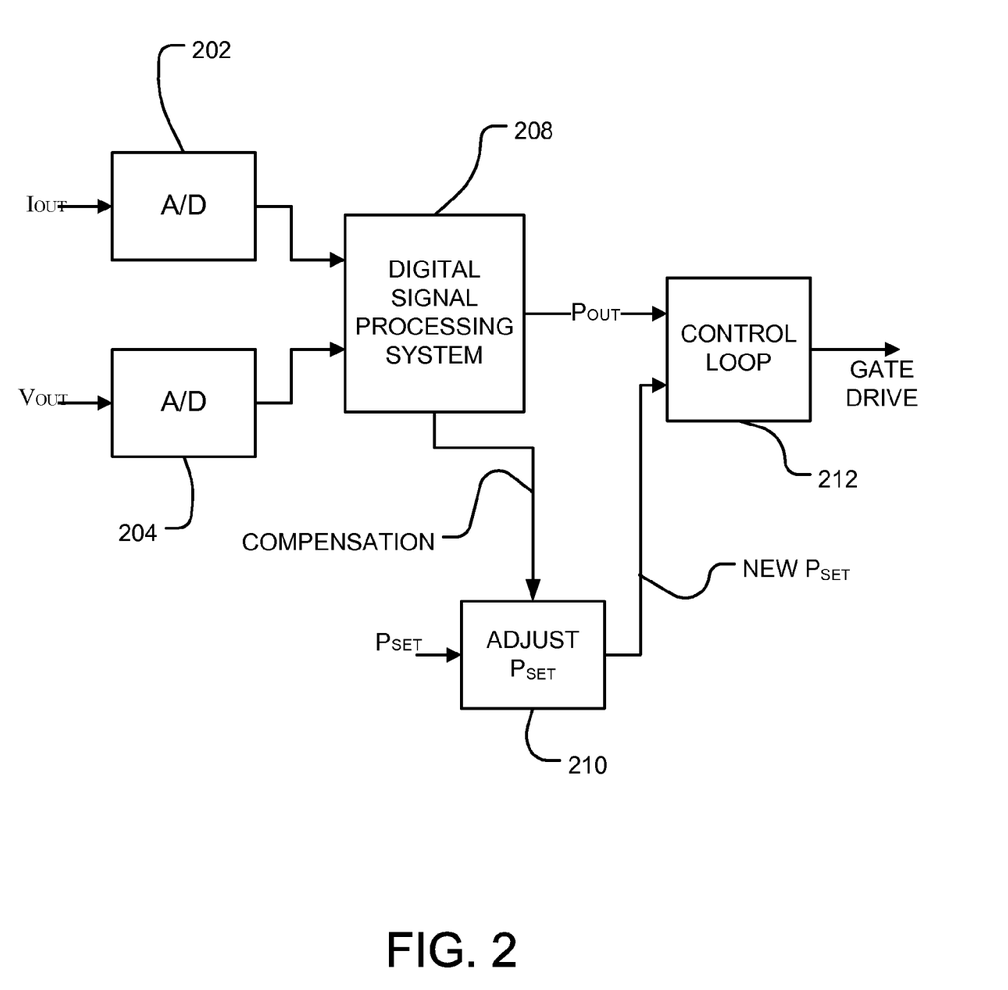
FIG. 2 shows a system diagram of one embodiment of a digital controller for controller 106 in FIG. 1.

Referring next to FIG. 2, it is a system diagram of a digital embodiment of controller 106 of FIG. 1. As shown, analog-to-digital converters 202 and 204 receive the $I_{OUT}$ and $V_{OUT}$ signals, respectively, and convert them to digital values for input to the digital signal processing system 208. The digital signal processing system 208 may be realized by hardware, software, firmware or a combination thereof. For example, the digital signal processing system 208 may include a digital signal processor, a field programmable gate array, a general purpose microprocessor or other device(s) for processing digital values. Many embodiments of the processing system 208 are configured to perform operations to provide a power out value $P_{OUT}$ indicating the current level of power being delivered to a plasma chamber. Further, the processing system 208 is configured to perform operations to provide a $P_{SET}$ compensation value, which is passed to the adjust $P_{SET}$ module 210 where it operates on the current $P_{SET}$ value to produce a new $P_{SET}$ value.

The $P_{SET}$ compensation value in one embodiment is a $\Delta P$ value (e.g., an incremental power value to be added to the current $P_{SET}$ value). In addition, a scalar may be applied to the $\Delta P$ value. Accordingly, in this embodiment the adjust $P_{SET}$ module 210 may be a digital summer that performs the operation: New $P_{SET}=P_{SET}+\Delta P$. In another embodiment the $P_{SET}$ compensation value is a compensation coefficient, $C_{COEF}$, value to be multiplied with the current $P_{SET}$ value. A scalar might also be applied to the compensation coefficient $C_{COEF}$. Accordingly in this embodiment the adjust $P_{SET}$ module 210 may be a digital multiplier that performs the operation: New $P_{SET}=P_{SET}\times C_{COEF}$.

As depicted, the new $P_{SET}$ is passed to control loop 212 and the control loop 212 also receives $P_{OUT}$ from processing system 208. Control loop 212 uses $P_{OUT}$ and New $P_{SET}$ to adjust the gate drives applied to the power switches in the power stage 102 to change $P_{OUT}$ to follow the value of the New $P_{SET}$. The control loop 212 may change duty-cycle, frequency, or phase of the gate drive signals.

Figure 3:
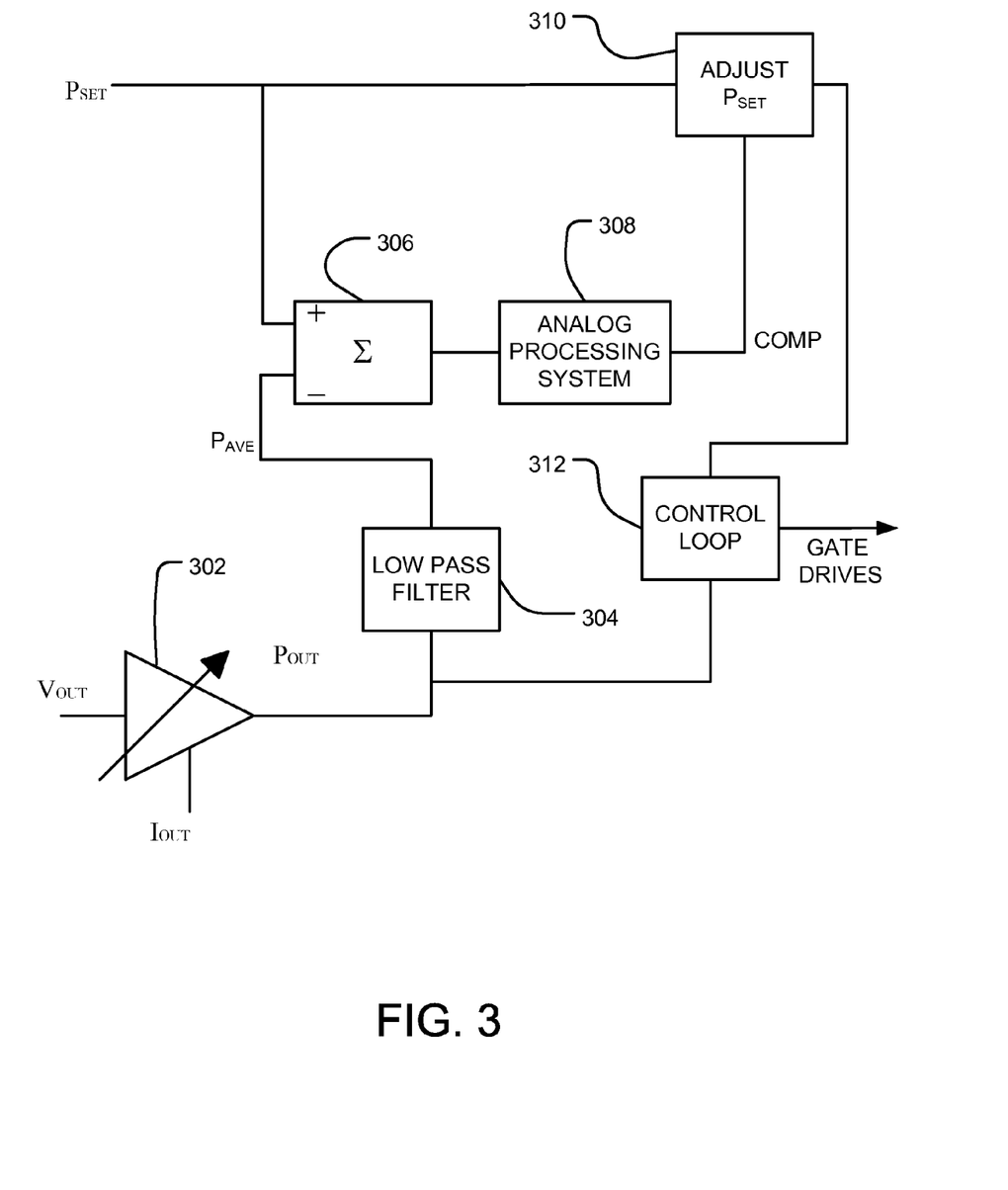
FIG. 3 shows a system diagram of one embodiment of an analog controller for controller 106 in FIG. 1.

FIG. 3 shows another embodiment for the controller 106 described with reference to FIG. 1, which is implemented as an analog system. In the exemplary analog embodiment of the controller, $V_{OUT}$ and $I_{OUT}$ are multiplied times each other in amplifier 302, and amplifier 302 performs an analog multiplication to generate the $P_{OUT}$ power value indicating the power currently being delivered to a plasma chamber (e.g., plasma chamber 104). Low pass filter 304 receives the $P_{OUT}$ value and removes the high frequency components of $P_{OUT}$ and passes the low frequency or slowly-varying $P_{OUT}$ value to summing circuit 306. The low pass filter 304 effectively passes an average power $P_{AVE}$ to summing operation 306.

Summing circuit 306 combines $P_{SET}$ with a negative $P_{AVE}$, or stated another way, summing circuit 306 takes the difference between $P_{AVE}$ and $P_{SET}$ to yield $\Delta P$, and the $\Delta P$ value is passed to analog processing system 308 which produces a compensation value. As depicted, the compensation value is passed to an adjust $P_{SET}$ module 310. The adjust $P_{SET}$ module will produce a new $P_{SET}$ value by adding $\Delta P$ to a current $P_{SET}$ value with or without a scalar, or by multiplying the current $P_{SET}$ value with a compensation coefficient with or without a scalar. As shown, the new $P_{SET}$ value is passed to control loop 312, which also receives $P_{OUT}$ from amplifier 302. Control loop 312 uses $P_{OUT}$ and the new $P_{SET}$ value to adjust duty-cycle, frequency or phase of the gate drives applied to the power switches in the power stage 102 (FIG. 1) to change $P_{OUT}$ to follow the value of the new $P_{SET}$.

Referring next to FIGS. 4-10, shown are flow charts depicting operations that may be performed in connection with various embodiments of the invention. These operational flows, for example, may be performed in the digital controller of FIG. 2 or the analog controller of FIG. 3 depending on the design choices made to create the best implementation for the design situation. The operations could be program processes in the digital controller and apparatus modules in the analog controller.

Figure 4:
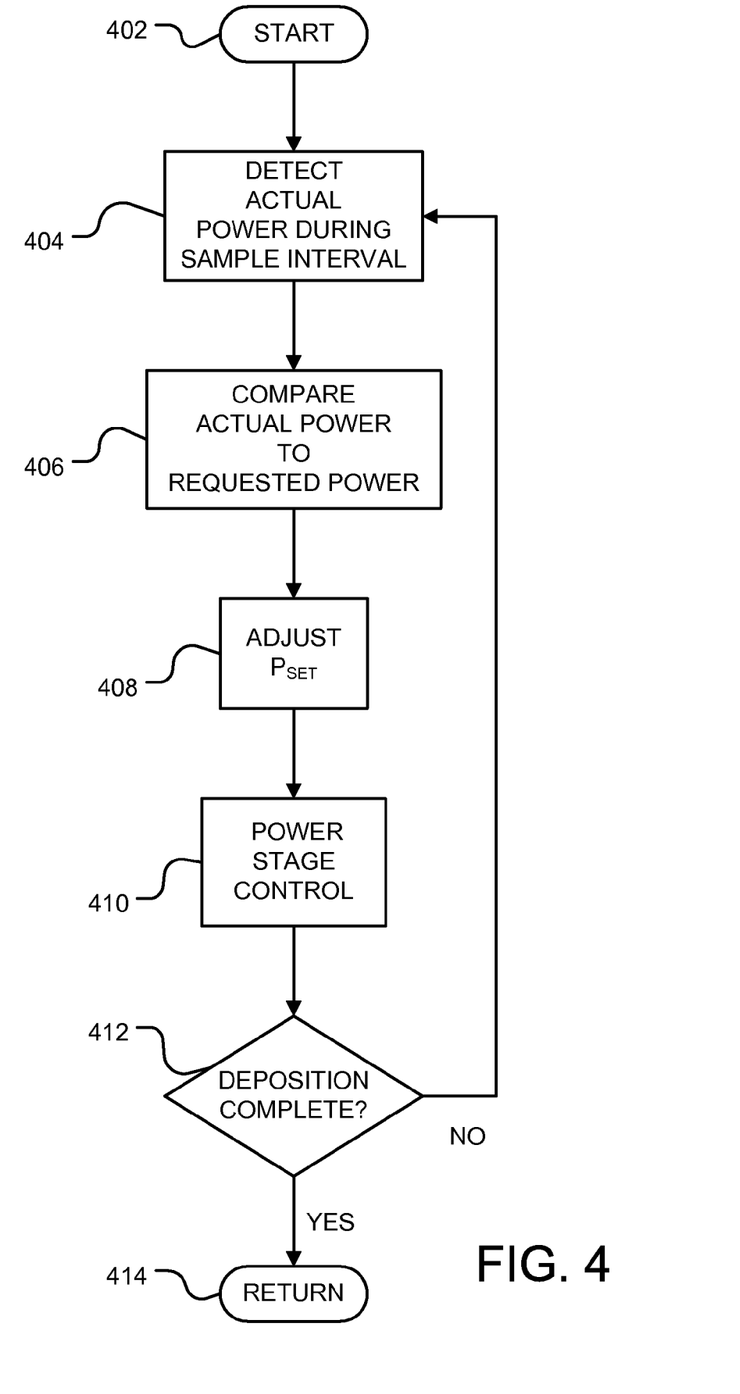
FIG. 4 is an operations flow diagram for operations performed in providing compensation to adjust $P_{SET}$ value in the digital controller in FIG. 2 or the analog controller in FIG. 3.

As depicted, FIG. 4 is a compensation operations flow diagram for adjusting $P_{SET}$ throughout a deposition process. The compensation operation flow is entered at start connector 402. Actual power detect operation 404 detects the power out $P_{OUT}$ supplied by the power stage 102 (FIG. 1) to the plasma chamber 104. Further, the detect operation 404 samples the actual power $P_{OUT}$ during a sampling interval $\Delta T$. The length of the sampling interval is a matter of choice. The sampling interval may be a few microseconds or a few seconds. It may even be so small as to represent a single point of data for $P_{OUT}$. In general, however, it is not so large so as to prevent the controller from providing real time control of the power stage during a deposition process. In other words the detect operation generally operates on a single point of data or an average of multiple points of data for $P_{OUT}$ over a sampling interval. Further, in addition to the digital signal processing system 208 of FIG. 2 performing the detect operation, the detection of actual power samples might be performed by low pass filters prior to the analog-to-digital converters in FIG. 2 or prior to the analog processing system 308 in FIG. 3. Other embodiments of the detect operation 404 involving arc detection or energy sampling will be described in various embodiments described hereinafter.

In FIG. 4 compare operation 406 receives the actual power out $P_{OUT}$ from detect operation 404 and compares it to the present power value $P_{SET}$. From this comparison, compare operation 406 generates a compensation value for use in updating $P_{SET}$. The adjust $P_{SET}$ operation 408 receives the compensation value from compare operation 406 and a current $P_{SET}$ value, and the adjust operation updates the current $P_{SET}$ value to a new $P_{SET}$ value and passes the new $P_{SET}$ value to power stage control operation 410. The power stage control operation 410 generates the power stage control signals for power stage 102 (FIG. 1). In FIGS. 2 and 3, for example, the power stage control operation 410 is performed in the control loops 212 and 312, respectively. Power stage control operation 410 compares the $P_{OUT}$ value to the new $P_{SET}$ value and generates gate drives for the power stage 102 (FIG. 1) for controlling $P_{OUT}$ in the ongoing deposition process.

In FIG. 4, deposition complete operation 412 is a decision operation testing whether the deposition process is complete. The user may program a preset deposition period, and the deposition complete operation 412 will detect when the deposition period has expired. Alternatively, the user may send a signal, or the plasma chamber may send a feedback signal, indicating deposition complete for detection by the deposition complete operation. If the deposition process is not complete, the operation flow branches NO back to the detect operation 404. If the deposition process is complete, the operation flow branches YES to return connector 414, and the operation flow returns to system control processes.

Figure 8:
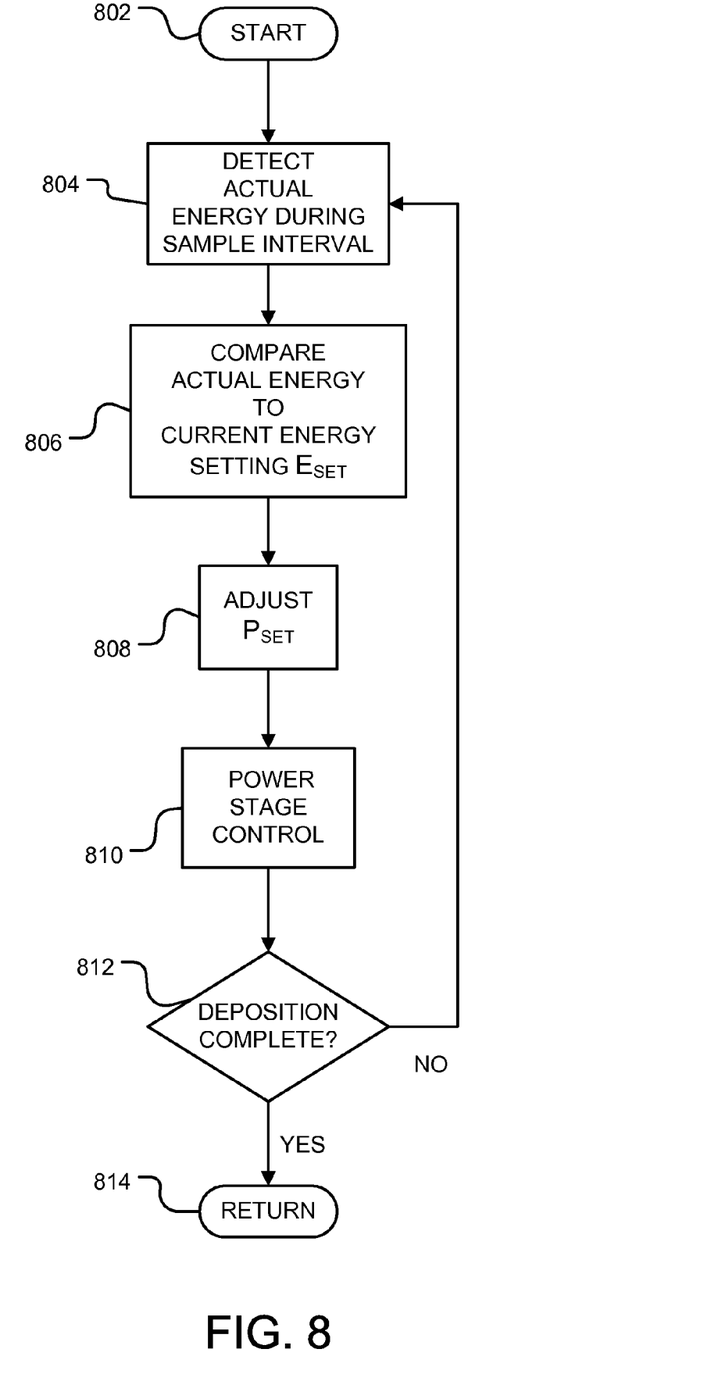
FIG. 8 shows the operational flow for another embodiment of the invention where the user specifies a power setting and a total energy to be delivered during the deposition process and thereby a duration for the deposition process.
Figure 9:
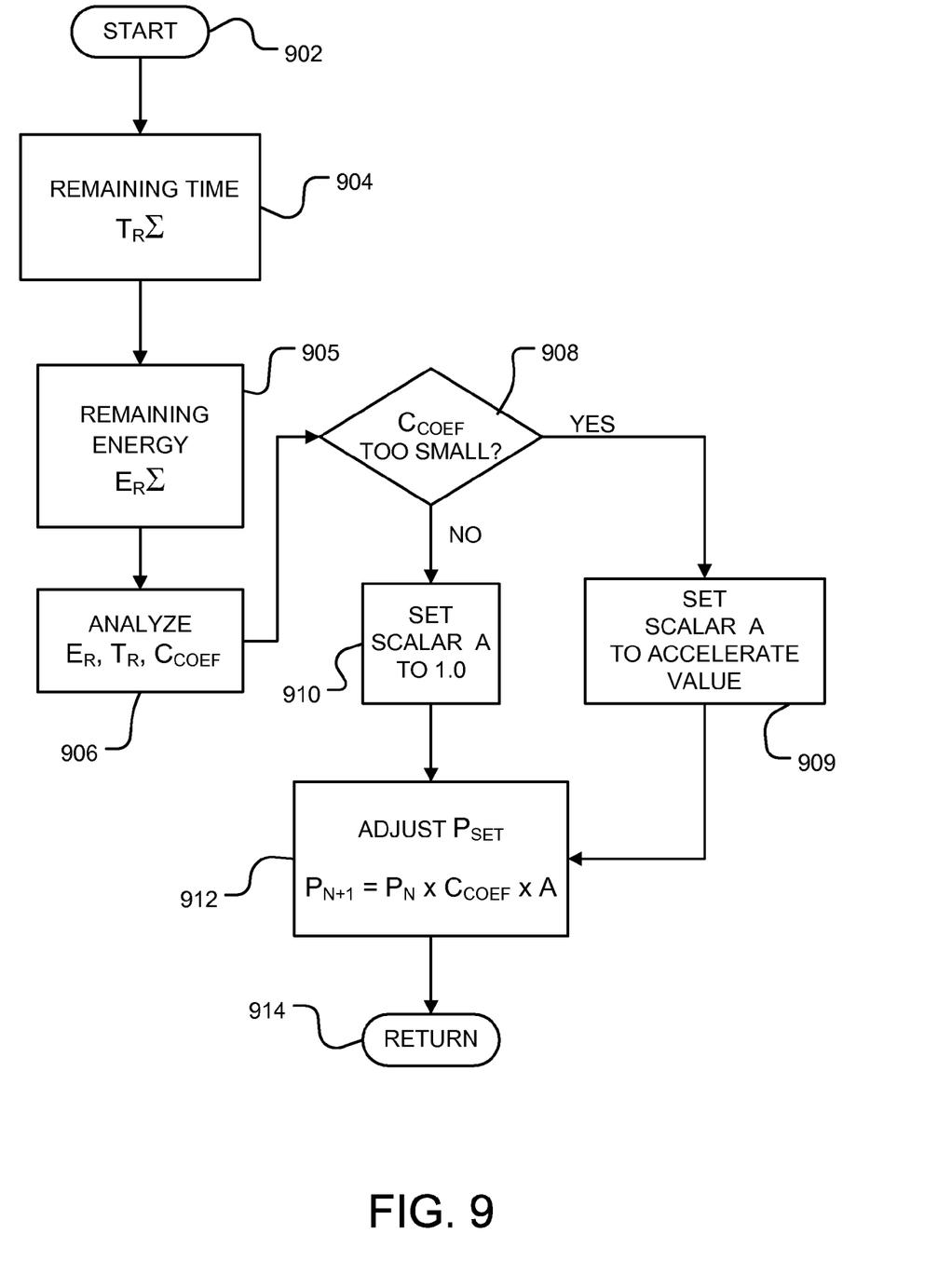
FIG. 9 shows an operations flow diagram for another embodiment of the invention where the user specifies a power setting and a total energy to be delivered during the deposition process, where the deposition period is a fixed time period derived from the power setting and total energy, and where an accelerating scalar is provided to increase an adjustment of power delivered to the plasma chamber so as to complete the deposition process in the fixed time period.
Figure 10:
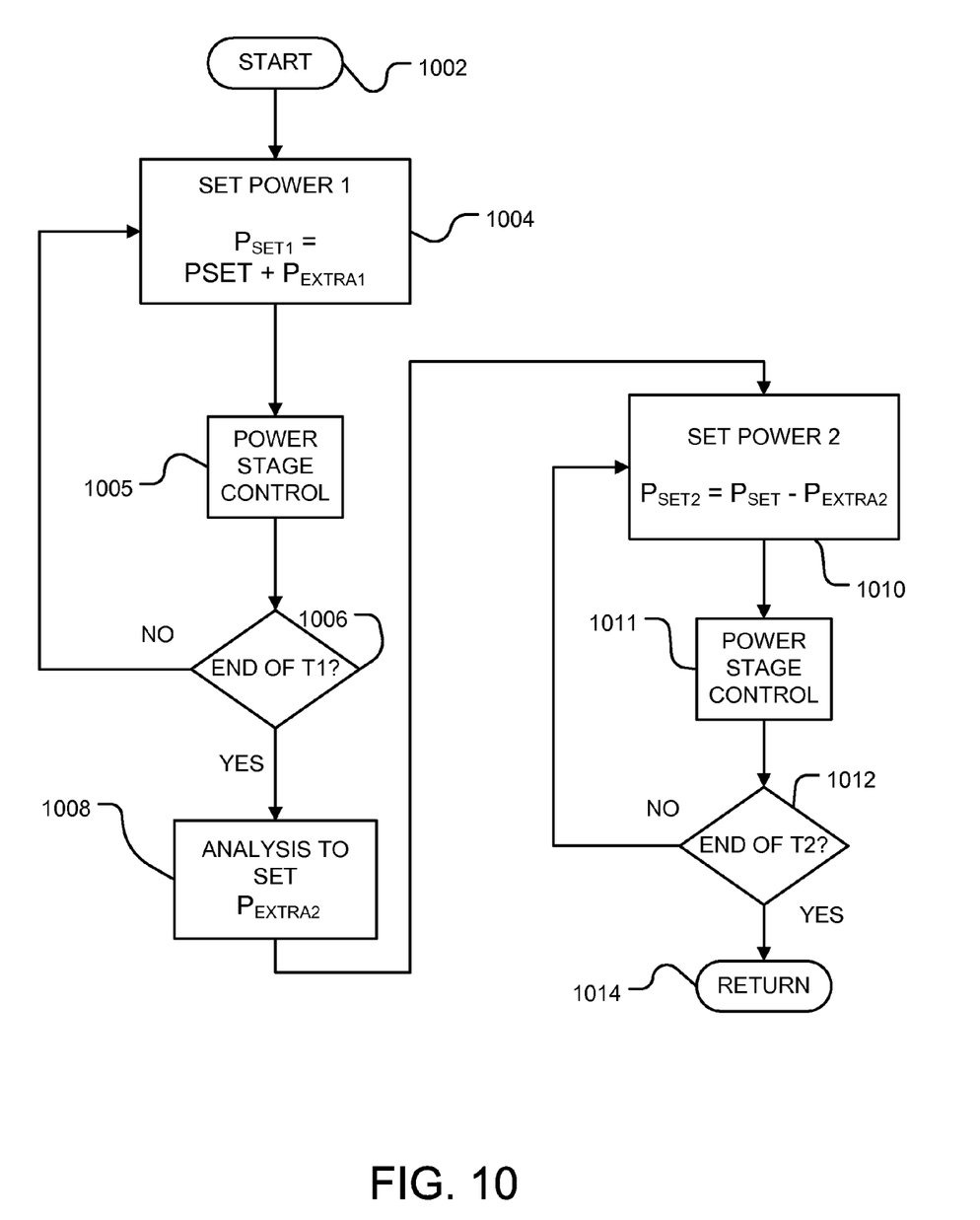
FIG. 10 shows another embodiment of the invention where the user specifies a power setting and a total energy to be delivered during the deposition process and thereby a duration for the deposition process, and where the duration of the deposition process is split into two intervals, and a different compensation is applied to the power setting during the two intervals.

While the compensation operation flow in FIG. 4 has been described from the viewpoint of using the power out $P_{OUT}$ value and the power set $P_{SET}$ value, it will be appreciated by one skilled in the art that the invention could also be embodied by designing the operations using $V_{OUT}$ or $I_{OUT}$ along with settings for $V_{SET}$ and $I_{SET}$ respectively. Likewise the compensation operation flow embodiments in FIGS. 5-10, may be embodied in systems and methods using voltage or current values rather than power values. Further, the embodiments in FIGS. 8-10 are compensation operation flows where the user specifies two of three variables: total energy $E_{TOT}$ to be delivered during the deposition process, duration $T_{SET}$ of the deposition process and the power setting $P_{SET}$ for the deposition process. Typically, the values $E_{TOT}$ and $T_{SET}$ are provided by the user to the controller 106 FIG. 1, and the duration $T_{SET}$ of the deposition process is derived therefrom by the equation $T_{SET} = E_{TOT}/P_{SET}$.

Figure 5:
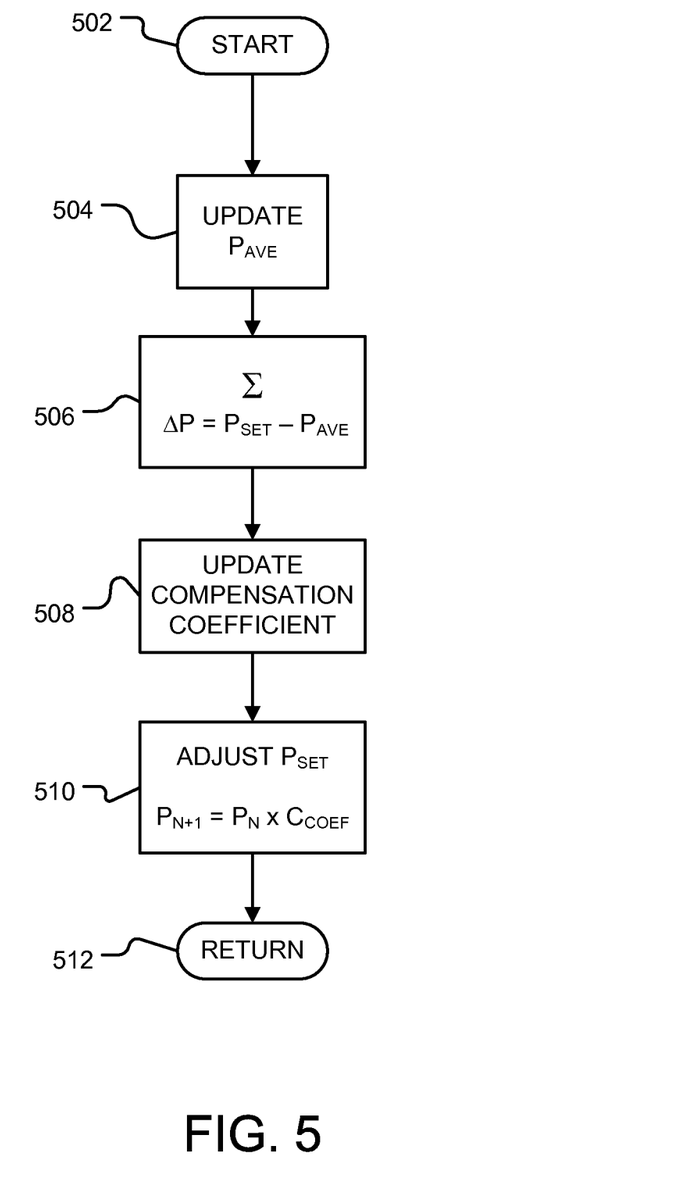
FIG. 5 shows an embodiment of the compensation operation flow where one embodiment of compare operation 406 and adjust $P_{SET}$ operation 408 of FIG. 4 are shown in more detail.

FIG. 5 shows an exemplary compensation operation flow that may be carried out to effectuate the compare operation 406 and adjust $P_{SET}$ operation 408 of FIG. 4. In this embodiment the current $P_{SET}$ is adjusted by multiplying it with a compensation coefficient during the deposition process to generate a new $P_{SET}$. The operation flow in FIG. 5 begins at flow connector 502 which starts the operation flow of FIG. 5 after detect operation 404 in FIG. 4. Update $P_{AVE}$ operation 504 in FIG. 5 receives the actual power out average value $P_{AVE}$ from detect operation 404 and saves it as an updated $P_{AVE}$ value. Summing operation 506 receives the updated $P_{AVE}$ value and the present power value $P_{SET}$ and subtracts $P_{AVE}$ from $P_{SET}$ to generate $\Delta P$, which is the difference between these power values. The $\Delta P$ value is effectively the short fall between the actual average power $P_{AVE}$ delivered in the deposition process during the sampling interval $\Delta T$ and the present power $P_{SET}$ that was previously set for the deposition process.

Update compensation coefficient operation 508 receives $\Delta P$ from summing operation 506 and generates the compensation coefficient $C_{COEF}$ for use in adjusting the current $P_{SET}$ value to a new $P_{SET}$ value. The compensation coefficient is given by the expression: $C_{COEF} = (P_N + \Delta P)/P_N$ where $P_N$ is the current $P_{SET}$ value. The adjust $P_{SET}$ operation receives the current $P_{SET}$ value and multiplies it by the compensation coefficient so that the new $P_{SET}$ value is given by the expression: $P_{N+1} = P_N \times C_{COEF}$, where $P_{N+1}$ is the new $P_{SET}$ value for the deposition process. After the current $P_{SET}$ is adjusted to the new $P_{SET}$ value the operation flow returns at return connector 512 to the update control operation 410 in FIG. 4. The new $P_{SET}$ value is used by update control operation 410 to generate new gate drives for the power stage 102.

Figure 6:
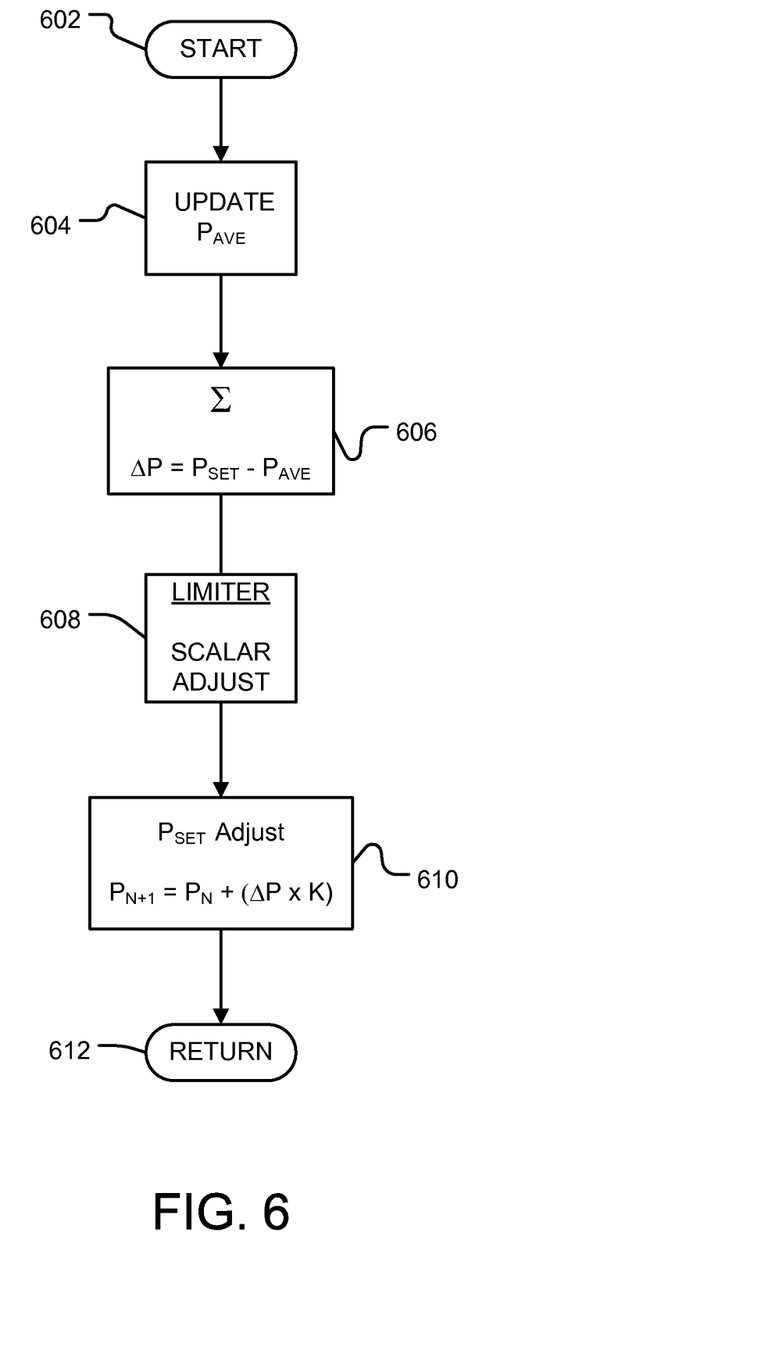
FIG. 6 shows another embodiment of the compensation operation flow with another embodiment of the compare operation 406 and adjust $P_{SET}$ operation 408 of FIG. 4 shown in more detail.

FIG. 6 shows another embodiment of the compensation operation flow with another embodiment of the compare operation 408 and adjust $P_{SET}$ operation 410 of FIG. 4 shown in more detail. In this embodiment the current $P_{SET}$ is modified by adding $\Delta P$ to the current $P_{SET}$ during the deposition process to generate a new $P_{SET}$ for the ongoing deposition process. In addition, $\Delta P$ is multiplied by a scalar K before being added to the current $P_{SET}$ value. The scalar is used to limit the adjustment of the $P_{SET}$ value by the $\Delta P$ value.

The operation flow in FIG. 6 begins at flow connector 602 which starts the operation flow of FIG. 6 after detect operation 404 in FIG. 4. Update $P_{AVE}$ operation 604 in FIG. 6 receives the actual power out average value $P_{AVE}$ from detect operation 404 and saves it as an updated $P_{AVE}$ value. Summing operation 606 receives the updated $P_{AVE}$ value and the present power value $P_{SET}$, and subtracts $P_{AVE}$ from $P_{SET}$ to generate $\Delta P$ which is the difference between these power values. The $\Delta P$ value is effectively the short fall in power between the actual power $P_{AVE}$ used in the deposition process during the sampling interval $\Delta T$ and the present power $P_{SET}$ that was set for the deposition process during the current sampling interval $\Delta T$ just completed.

Limiter operation 608 receives the $\Delta P$ value from summing operation 606 and analyses $\Delta P$ to set a scalar K to modify $\Delta P$. The scalar K is a limiting factor to be applied to $\Delta P$. For example, if an unusual number of arcs occur during a sampling interval $\Delta T$, the $\Delta P$ value might be so large that an incremental adjustment of $P_{SET}$ with such a large $\Delta P$ would damage the quality of the deposition process. Accordingly, the scalar K would be set so that only a fraction of $\Delta P$ is used to increment the $P_{SET}$ value.

$P_{SET}$ adjust operation 610 receives the current $P_{SET}$ value, the $\Delta P$ value and the scalar K and updates the new $P_{SET}$ value in accordance with the following expression:

$$P_N + 1 = P_N + (\Delta P \times K)$$

where:

$P_N+1$ is the new $P_{SET}$ value, and $P_N$ is the current $P_{SET}$ value used during the sampling interval $\Delta T$, and K is the limiting scalar from limiter operation 608.

In an alternative embodiment the limiter operation 608 is a limiting clipper operation that limits $\Delta P$ to a maximum value. In other words if $\Delta P$ exceeds a maximum value, it is clipped and limited to the maximum value.

After the current $P_{SET}$ is updated to the new $P_{SET}$ value the operation flow returns at return connector 612 to the update control operation 410 in FIG. 4. The new $P_{SET}$ value is used by update control operation 410 to generate new gate drives as described above.

While the scalar K has been described in an embodiment where $P_{SET}$ is updated by being incremented with $\Delta P$, the use of a scalar to limit adjustment of $P_{SET}$ can just as well be done in embodiments using a compensation coefficient $C_{COEF}$. In such an embodiment the scalar would just be a factor in the coefficient (i.e., multiplied times the coefficient).

Figure 7:
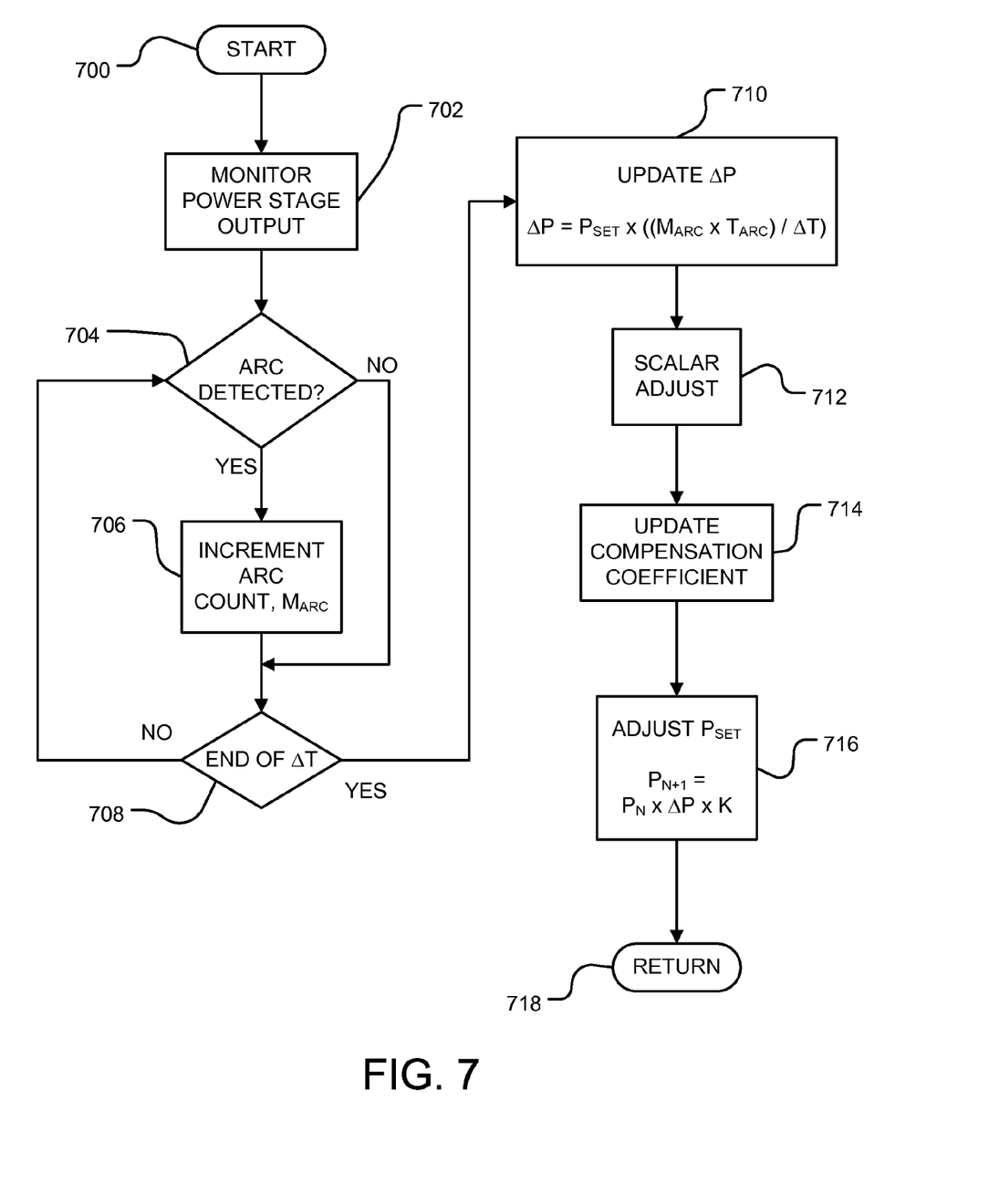
FIG. 7 shows another embodiment of the invention where the actual power delivered during the sampling interval is detected by counting the number of arcs occurring in the deposition chamber during the sampling interval to determine the power lost and then reducing the power requested by the power lost.

FIG. 7 shows another embodiment of the invention where the detect operation 404 of FIG. 4 detects actual power used during the sampling interval by detecting the number of arcs occurring in the deposition chamber during the sampling interval. Further, FIG. 7 shows another embodiment of the compare operation 406 and adjust $P_{SET}$ operation 408 in FIG. 4. The actual power delivered during the sampling interval is found by subtracting the power lost because of arcs during the sampling interval from the power that would have been delivered during the sampling interval if the arcs had not occurred.

The operation flow in FIG. 7 begins at flow connector 700 which starts the operation flow of FIG. 7 at the beginning of the operation flow in FIG. 4. In this embodiment arc monitor operation 702 monitors the output of the power stage 102 (FIG. 1) looking for spikes or abrupt changes in $V_{OUT}$, $I_{OUT}$ or $P_{OUT}$. Such an abrupt change indicates an arc occurring in the deposition chamber. The arc will typically last less than a few microseconds before the power stage recovers, and $P_{OUT}$ returns to $P_{SET}$. When arc monitor operation 702 detects an arc, it generates an arc indicator or arc flag. Arc decision operation 740 tests for an arc indicator or flag from arc monitor 702. If an arc has not been detected, the operation flow branches NO to sampling interval test operation 708, and if an arc has been detected, the operation flow branches YES to increment operation 706. Increment operation 706 advances the arc count $M_{ARC}$ by one count and resets monitor operation 702 to detect the next arc. The operation flow then passes from increment operation to sampling interval test operation 708.

The sampling interval test operation 708 is looking for the end of sampling interval $\Delta T$. Until the sampling interval is completed, the operation flow branches NO from test operation 708 and stays in a loop between arc decision operation 704 and sampling interval test operation 708. Accordingly every arc occurring during the sampling interval will be counted by increment operation 706. When the sampling interval is completed, the operation flow will branch YES from sampling interval test operation 708 to update ΔP operation 710.

Update ΔP operation 710 will generate the ΔP value for the sampling interval by taking the difference between power that would have been delivered to the plasma chamber if there were no arcs and the power lost during the arcs. The equation for ΔP reduces to the following expression:

$$\Delta P = P_N \times ((M_{ARC} \times T_{ARC})/\Delta T)$$

where:
$P_N$ is the current $P_{SET}$ value,
$M_{ARC}$ is the arc count, number of arcs occurring during the sampling interval,
$T_{ARC}$ is the time duration of an arc including recovery time, and
$\Delta T$ is the sampling interval.

The current $P_{SET}$ value is initially defined by the user and is adjusted during the process after each sampling interval $\Delta T$. The sampling interval $\Delta T$ is a constant defined by the design of the controller 106 (FIG. 1). The arc count $M_{ARC}$ and an arc duration time interval $T_{ARC}$ are also used in the update ΔP operation 710. The arc duration time interval $T_{ARC}$ is a constant programmed into the process. $T_{ARC}$ is known because the recovery time of the power stage after an arc incident is known. The arc count $M_{ARC}$ comes from increment operation 706, and the update ΔP operation 710 resets $M_{ARC}$ to zero in increment operation 706 after receiving the count.

Scalar adjust operation 712 receives the ΔP value from update ΔP operation 710 and analyzes ΔP to set a scalar K to modify ΔP. The scalar K is a limiting factor to be applied to ΔP. As previously described, if an unusual number of arcs occur during a sampling interval $\Delta T$, the ΔP value might be so large that an incremental adjustment of $P_{SET}$ with such a large ΔP would damage the quality of the deposition process. Accordingly, the scalar K would be set in this situation so that only a fraction of ΔP is used to increment the $P_{SET}$ value. Alternatively, ΔP might be limited to a maximum value by a limiting clipper operation as previously described with reference to limiter operation 608 (FIG. 6).

Update compensation coefficient operation 714 receives ΔP from update ΔP operation 710 and scalar K from scalar adjust operation 712. Update compensation coefficient operation 714 generates the compensation coefficient $C_{COEF}$ for use in adjusting the current $P_{SET}$ value to a new $P_{SET}$ value. The compensation coefficient is given by the expression:

$$C_{COEF} = ((P_N + \Delta P)/P_N) \times K$$

where
$P_N$ is the current $P_{SET}$ value, and
K is the limiting scalar received from scalar adjust operation 712.

The $P_{SET}$ adjust operation 716 receives the current $P_{SET}$ value and the compensation $C_{COEF}$ and updates $P_{SET}$ to the new $P_{SET}$ value in accordance with the following expression:

$$P_{N+1} = P_N \times C_{COEF}$$

where:
$P_{N+1}$ is the new $P_{SET}$ value,
$P_N$ is the current $P_{SET}$ value used during the sampling interval $\Delta T$, and
$C_{COEF}$ is the compensation coefficient.

After the current $P_{SET}$ value is adjusted to the new $P_{SET}$ value, the operation flow returns at return connector 718 to the update control operation 410 in FIG. 4. The new $P_{SET}$ value is used by update power stage control operation 410 to generate new gate drives as described above.

While the scalar K has been described in this embodiment where $P_{SET}$ is updated by being incorporated into the compensation coefficient, the use of a scalar to limit adjustment of $P_{SET}$ can just as well be done by applying the limiting scalar in the adjust $P_{SET}$ operation 716 rather than the update compensation coefficient operation.

FIG. 8 shows the compensation operation flow for another embodiment of the invention where the user specifies two of three variables: 1) $P_{SET}$, power setting for the deposition process, 2) $E_{TOT}$, the total energy to be delivered during the deposition process, and 3) $T_{SET}$, the duration of the deposition process. The three variables are related by the equation $$E_{TOT} = P_{SET} \times T_{SET}$$

and therefore, if the user specifies two variables, the third variable can be derived. Typically, a user might specify total energy $E_{TOT}$ and power setting $P_{SET}$.

The compensation operation flow is entered at start connector 802. Actual energy detect operation 804 detects the energy out $E_{OUT}$ delivered by the power stage 102 (FIG. 1) to the plasma chamber 104 during a sampling interval $\Delta T$. The length of the sampling interval is a matter of choice as previously described with reference to FIG. 4. Compare operation 806 receives the actual energy delivered $E_{OUT}$ during the sampling interval $\Delta T$ from detect operation 804 and compares it to the current energy setting $E_{SET}$ where $E_{SET} = P_{SET} \times \Delta T$. From this comparison, compare operation 806 generates a compensation value for use in adjusting $P_{SET}$. The compensation value in one embodiment is $\Delta P = \Delta E/\Delta T = (E_{SET} - E_{OUT})/\Delta T$. In another embodiment the compensation value is a compensation coefficient given by the expression: $C_{COEF} = 1 + (\Delta E/E_{SET})$. In both of these embodiments for generating the compensation value, $E_{SET}$ is the current energy setting before $P_{SET}$ is adjusted in adjust $P_{SET}$ operation 808.

The adjust $P_{SET}$ operation 808 receives the compensation value from compare operation 806 and the current $P_{SET}$ value used in the sampling interval. In one embodiment of the FIG. 8 operation flow, adjust $P_{SET}$ operation 808 updates the current $P_{SET}$ value to a new $P_{SET}$ value by adding ΔP compensation value from the compare operation 806 to the current $P_{SET}$ value. In another embodiment of the FIG. 8 operation flow, adjust $P_{SET}$ operation 808 updates the current $P_{SET}$ value to a new $P_{SET}$ value by multiplying the current $P_{SET}$ value by the compensation coefficient $C_{COEF} = 1 + (\Delta E/E_{SET})$ received as the compensation value from compare operation 806.

The new $P_{SET}$ value is passed to power stage control operation 810. The power stage control operation 810 generates the power stage control signals for power stage 102 (FIG. 1). In FIGS. 2 and 3 the power stage control operation is performed in the control loops 212 and 312 respectively. In FIG. 8, deposition complete operation 812 is a decision operation testing whether the deposition process is complete. Since the duration $T_{SET}$ of the deposition process is provided or derived in the embodiment of FIG. 8, the deposition complete operation 812 will detect when the deposition period has expired. If the deposition process has not expired, the operation flow branches NO and loops back to detect operation 804. If the deposition process has expired, the operation flow branches YES to return connector 814, and the operation flow returns to system control processes.

FIG. 9 shows a compensation operation flow for another embodiment where the user provides two of the three variables: 1) $E_{TOT}$, total energy, 2) $P_{SET}$, power setting, and 3) $T_{SET}$, duration of the deposition process, and where an acceleration scalar increases the adjustment of $P_{SET}$. The acceleration scalar enables the deposition process to be completed in the fixed time period $T_{SET}$. In this embodiment the operations in FIG. 9 replace the adjust $P_{SET}$ operation 810 in FIG. 8

The operation flow in FIG. 9 begins at flow connector 902 which starts the operation flow of FIG. 9 after compare energy operation 806 in FIG. 8. In FIG. 9 remaining time summing operation 904 receives the fixed time period $T_{SET}$ for the deposition process and the elapsed time $T_{ELPSD}$ consumed since the beginning of the deposition process. The elapsed time $T_{ELPSD}$ is tracked by a clock started when the deposition process starts. Remaining time $T_R$ summing operation 904 subtracts the elapsed Time $T_{ELPSD}$ from $T_{SET}$ to yield the remaining time $T_R$.

The remaining energy $E_R$ summing operation 905 receives the total energy $E_{TOT}$ to be delivered in the process and the delivered energy $E_{DLVD}$ consumed since the beginning of the deposition process. The delivered energy $E_{DLVD}$ is tracked by accumulating an energy value corresponding to all of the energy delivered since the deposition process started. Remaining energy $E_R$ summing operation 905 subtracts the delivered energy $E_{DLVD}$ from the total energy $E_{TOT}$ to yield the remaining $E_R$.

Analyze operation 906 receives the remaining time $T_R$ from the remaining time summing operation 904, the remaining energy $E_R$ from remaining energy summing operation 905, and the compensation coefficient $C_{COEF}$ from compare operation 806 (FIG. 8). Analyze operation 906 analyzes $E_R$, $T_R$, and $C_{COEF}$, and indicates if the compensation coefficient $C_{COEF}$ is too small to adjust the $P_{SET}$ value to provide the remaining energy $E_R$ needed to complete the deposition in the remaining time $T_R$ before the deposition period $T_{SET}$ expires. Analyze operation 906 may also determines an accelerate value that can be multiplied times $C_{COEF}$ and the current power setting so that that the adjustment of $P_{SET}$ will be large enough to complete the deposition.

The compensation-too-small test operation 908 detects whether analyze operation 906 has indicated that the compensation coefficient $C_{COEF}$ is too small. If the coefficient $C_{COEF}$ is too small for sufficient adjustment of $P_{SET}$ in the remaining time $T_R$, the operation flow branches YES to set accelerate scalar operation 909. The set accelerate scalar operation 909 receives the accelerate value from the evaluate operation 906 and sets scalar A to an accelerate value. If the coefficient $C_{COEF}$ is not too small, the operation flow branches NO to set accelerate scalar operation 910. Set scalar operation 910 sets scalar A to one (1.0).

Adjust $P_{SET}$ operation 912 receives the current $P_{SET}$ value, the compensation coefficient $C_{COEF}$ value and the scalar A from either set operation 909 or set operation 910. Adjust $P_{SET}$ operation 912 updates the current $P_{SET}$ value to a new $P_{SET}$ value in accordance with the following expression:

$$P_{N+1} = P_N \times C_{COEF} \times A$$

where:
$P_{N+1}$ is the new $P_{SET}$ value,
$P_N$ is the current $P_{SET}$ value,
A is the accelerate scalar, and
$C_{COEF} = 1 + (\Delta E / E_{SET})$ where $E_{SET}$ is $P_N \times \Delta T$.

After the current $P_{SET}$ is adjusted to the new $P_{SET}$ value, the operation flow returns at return connector 914 to the power stage control operation 810 in FIG. 8. The new $P_{SET}$ value is used by power stage control operation 810 to generate new gate drives.

FIG. 10 shows another embodiment of the invention where the user provides two of the three variables: 1) $E_{TOT}$, total energy, 2) $P_{SET}$, power setting, and 3) $T_{SET}$, duration of the deposition process, and where the deposition process time $T_{SET}$ is split into two intervals T1 and T2. A different compensation is applied to adjust $P_{SET}$ during the two intervals.

Almost all of the deposition process occurs during interval T1 while an extra compensation $P_{EXTRA1}$ is applied to $P_{SET}$ to adjust it to $P_{SET1}$. Accordingly, during T1 some amount of extra energy above that needed for deposition during T1 is delivered by the end of time interval T1. During a closing interval T2 of the deposition process a final compensation $P_{EXTRA2}$ is applied to $P_{SET}$ to adjust it to $P_{SET2}$ so that the energy $E_{T1}$ delivered during interval T1 plus the energy $E_{T2}$ delivered during interval T2 will equal the total energy $E_{TOT}$ originally requested by the user for delivery during the deposition.

In FIG. 10 the compensation operation flow begins at start connector 1002 when the system control operation flow calls for this compensation operation flow. In set power 1 operation 1004, the power setting $P_{SET1}$ for time interval T1 is set by adding the power adjustment $P_{EXTRA1}$ to $P_{SET}$. $P_{EXTRA1}$ is large enough so that over the duration $T_{SET}$ of the deposition process all energy lost due to arcs will be compensated. Power stage control operation 1005 receives the $P_{SET1}$ power setting for interval T1 and generates the gate drives to control the power stage 102 (FIG. 1). Until T1 test operation 1006 detects the end of the time interval T1, the operation flow branches NO and loops back to set power 1 operation 1004. When T1 test operation 1006 detects the end of the time interval T1, the operation flow branches YES to analysis operation 1008.

Analysis operation 1008 analyzes the energy $E_{T1}$ delivered during T1 and the energy $E_{T2}$ to be delivered during closing interval T2 to achieve the total energy $E_{TOT}$ requested. The $P_{EXTRA1}$ was set so that energy $E_{T1}$ delivered during interval T1 is great enough to allow the deposition to be completed with a power setting $P_{SET2}$ during the closing interval T2 that is reduced from $P_{SET}$. After analysis operation 1008 determines energy $E_{T2}$ necessary to complete the deposition process, the analysis operation 1008 sets a fixed power adjustment $P_{EXTRA2}$ that is subtracted from $P_{SET}$ to yield the power setting $P_{SET2}$ for the closing interval T2.

Set power 2 operation 1010 receives $P_{XTRA2}$ from analysis operation 1008 and subtracts $P_{XTRA2}$ from $P_{SET}$ to set $P_{SET2}$ for the power stage control operation 1011. Power stage control operation 1011 receives the $P_{SET2}$ power setting for interval T2 and generates the gate drives to control the power stage 102 (FIG. 1). The T2 test operation 1012 is testing for expiration of interval T2. Until T2 test operation 1012 detects the end of the time interval T2, the operation flow branches NO and loops back to set power 2 operation 1010. When T2 test operation 1012 detects the end of the time interval T2, the operation flow branches YES to return connector 1014. The end of time interval T2 is also the end of the duration $T_{SET}$ of the deposition process. With the deposition complete the operation flow returns to the system control operation flow.

While the invention has been particularly shown and described with reference to multiple embodiments thereof, it will be understood by those skilled in the art that various other changes in the form and details may be made therein without departing form the spirit and scope of the invention.

What is claimed is:
1. A method for controlling a power supply configured to supply a power to a plasma chamber during a deposition process within the plasma chamber, comprising:

acquiring a user power setting of the power supply, where the user power setting is a starting point for an internal power setting of the power supply;

detecting at least one arc within the plasma chamber during the deposition process;

reducing the internal power setting in response to the detecting;

detecting a substantial absence of arcs within the plasma chamber after the reducing; and increasing the internal power setting, in response to the detecting the substantial absence of arcs, such that an average power supplied to the plasma chamber during the deposition process is equal to an average power that would have been supplied to the plasma chamber had the internal power setting remained at the user power setting for a preset duration of the deposition process.

2. The method of claim 1, wherein the increasing includes:

taking a difference in power between the average power supplied to the plasma chamber during a period spanning the start of the deposition process to a moment of the increasing, and the user power setting; and adjusting the internal power setting based on the difference.

3. The method of claim 1, wherein the internal power setting of the increasing has a fixed upper limit that is independent of the power supplied to the plasma chamber.

4. The method of claim 1, wherein reductions in power resulting from the reducing the internal power setting are compensated during the deposition process without extending a duration of the deposition process past the preset duration of the deposition process.

5. The method of claim 1 wherein the increasing further comprises:

subtracting a time elapsed since the deposition process began from the preset duration of the deposition process to generate a remaining time value;

subtracting energy delivered since the deposition process began from a total energy to be delivered to the plasma chamber during the preset duration of the deposition process to generate a remaining energy value; and modifying the internal power setting to equal the remaining energy value divided by the remaining time value.

6. The method of claim 1 further comprising:

detecting arcs in the plasma chamber;

counting a number of arcs occurring during a sampling interval; and generating a compensation value from the number of arcs occurring during the sampling interval and an estimated average duration of one arc.

7. The method of claim 6 wherein the increasing further comprises:

subtracting a time elapsed since the deposition process began from the preset duration of the deposition process to generate a remaining time value for the deposition process;

subtracting energy delivered since the deposition process began from a total energy to be delivered to the plasma chamber during the preset duration of the deposition process to generate a remaining energy value;

generating a compensation coefficient based on analyzing the compensation value, the remaining time value, and the remaining energy value; and modifying the internal power setting based on at least the compensation coefficient.

8. The method of claim 7, wherein the modifying the internal power setting is based on the compensation coefficient and an accelerate scalar, the accelerate scalar selected so that the internal power setting is modified such that energy is delivered to the plasma chamber, equal to the remaining energy value, within a time equal to the remaining time value.

9. The method of claim 1, further comprising:

determining a compensation coefficient as:

$1+(E_{SET}-E_{OUT})/E_{SET}$ where $E_{SET}$ is the internal power setting and $E_{OUT}$ is the power applied to the plasma chamber; and multiplying the internal power setting times the compensation coefficient.

10. The method of claim 1, wherein the increasing the internal power setting to a value greater than the user power setting.

11. A method for controlling a supply configured to supply an average power to a plasma chamber during a first and second interval of a deposition process within the plasma chamber, said method comprising:

acquiring a user power setting of the power supply, where the user power setting is a starting point for an internal power setting of the power supply;

setting the internal power setting of the power supply equal to the user power setting plus a first power adjustment at a start of a first interval of the deposition process;

detecting at least one arc within the plasma chamber during the first interval of the deposition process;

reducing the internal power setting in response to the first detecting during the first interval;

detecting a first substantial absence of arcs within the plasma chamber after the first reducing;

adjusting the internal power setting, in response to the second detecting of the first substantial absence of arcs, such that a first average power supplied to the plasma chamber during the first interval is equal to a first reference average power that would have been supplied to the plasma chamber had the internal power setting remained at the user power setting plus the first power adjustment for a preset duration of the first interval; then setting the internal power setting of the power supply equal to the user power setting minus a second power adjustment at the start of a second interval of the deposition process;

detecting at least one arc within the plasma chamber during the second interval of the deposition process;

reducing the internal power setting in response to the third detecting during the second interval detecting a second substantial absence of arcs within the plasma chamber after the second reducing; and adjusting the internal power setting, in response to the fourth detecting of the second substantial absence of arcs, such that a second average power supplied to the plasma chamber over the combined first and second intervals is equal to a second reference average power that would have been supplied to the plasma chamber had the internal power setting remained at the user power setting for a preset duration of a sum of the first and second intervals.

* * * * *